(12) United States Patent
Huang et al.

(10) Patent No.: US 8,158,014 B2
(45) Date of Patent: Apr. 17, 2012

(54) MULTI-EXPOSURE LITHOGRAPHY EMPLOYING DIFFERENTIALLY SENSITIVE PHOTORESIST LAYERS

(75) Inventors: Wu-Song Huang, Brewster, NY (US);
Wai-kin Li, Beacon, NY (US);
Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 912 days.

(21) Appl. No.: 12/139,722

(22) Filed: Jun. 16, 2008

(65) Prior Publication Data
US 2009/0311491 A1 Dec. 17, 2009

(51) Int. Cl.
*C03C 15/00* (2006.01)
*H01L 21/31* (2006.01)

(52) U.S. Cl. ........... 216/41; 438/947; 438/948; 438/780

(58) Field of Classification Search .............. 216/41
See application file for complete search history.

(56) References Cited

U.S. PATENT DOCUMENTS

| | | | |
|---|---|---|---|
| 4,657,629 A * | 4/1987 | Bigelow | 438/725 |
| 4,721,601 A * | 1/1988 | Wrighton et al. | 422/82.03 |
| 5,130,259 A * | 7/1992 | Bahraman | 438/77 |
| 5,686,223 A | 11/1997 | Cleeves | |
| 6,534,370 B2 * | 3/2003 | Park | 438/300 |
| 6,566,019 B2 | 5/2003 | Kling et al. | |
| 6,821,689 B2 | 11/2004 | Pierrat | |
| 6,951,709 B2 * | 10/2005 | Li | 430/316 |
| 7,429,536 B2 * | 9/2008 | Abatchev et al. | 438/725 |
| 2004/0009434 A1 * | 1/2004 | Lin et al. | 430/312 |
| 2005/0040435 A1 * | 2/2005 | Ono | 257/202 |

FOREIGN PATENT DOCUMENTS

JP  2002-314857  10/2002

OTHER PUBLICATIONS

Saito et al., "Photosensitivity in Silica-based Waveguides Deposited by Atmospheric Presure Chemical Vapor Deposition", Apr. 1998, Applied Optics, vol. 37, No. 12, pp. 2242-2244.*

* cited by examiner

*Primary Examiner* — Binh X Tran
*Assistant Examiner* — Thomas Pham
(74) *Attorney, Agent, or Firm* — Scully, Scott, Murphy & Presser, P.C.; Yuanmin Cai

(57) ABSTRACT

A stack of a second photoresist having a second photosensitivity and a first photoresist having a first photosensitivity, which is greater than second photosensitivity, is formed on a substrate. A first pattern is formed in the first photoresist by a first exposure and a first development, while the second photoresist underneath remains intact. A second pattern comprising an array of lines is formed in the second photoresist. An exposed portion of the second photoresist underneath a remaining portion of the first photoresist forms a narrow portion of a line pattern, while an exposed portion of the second photoresist outside the area of the remaining portions of the photoresist forms a wide portion of the line pattern. Each wide portion of the line pattern forms a bulge in the second pattern, which increases overlay tolerance between the second pattern and the pattern of conductive vias.

17 Claims, 11 Drawing Sheets

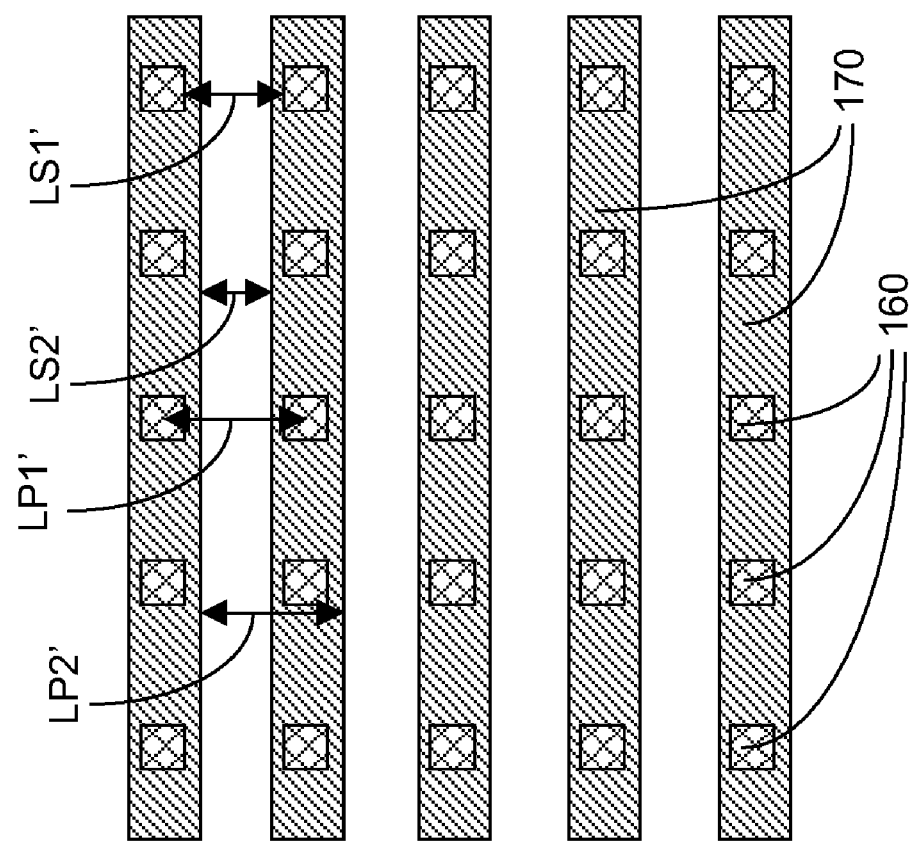

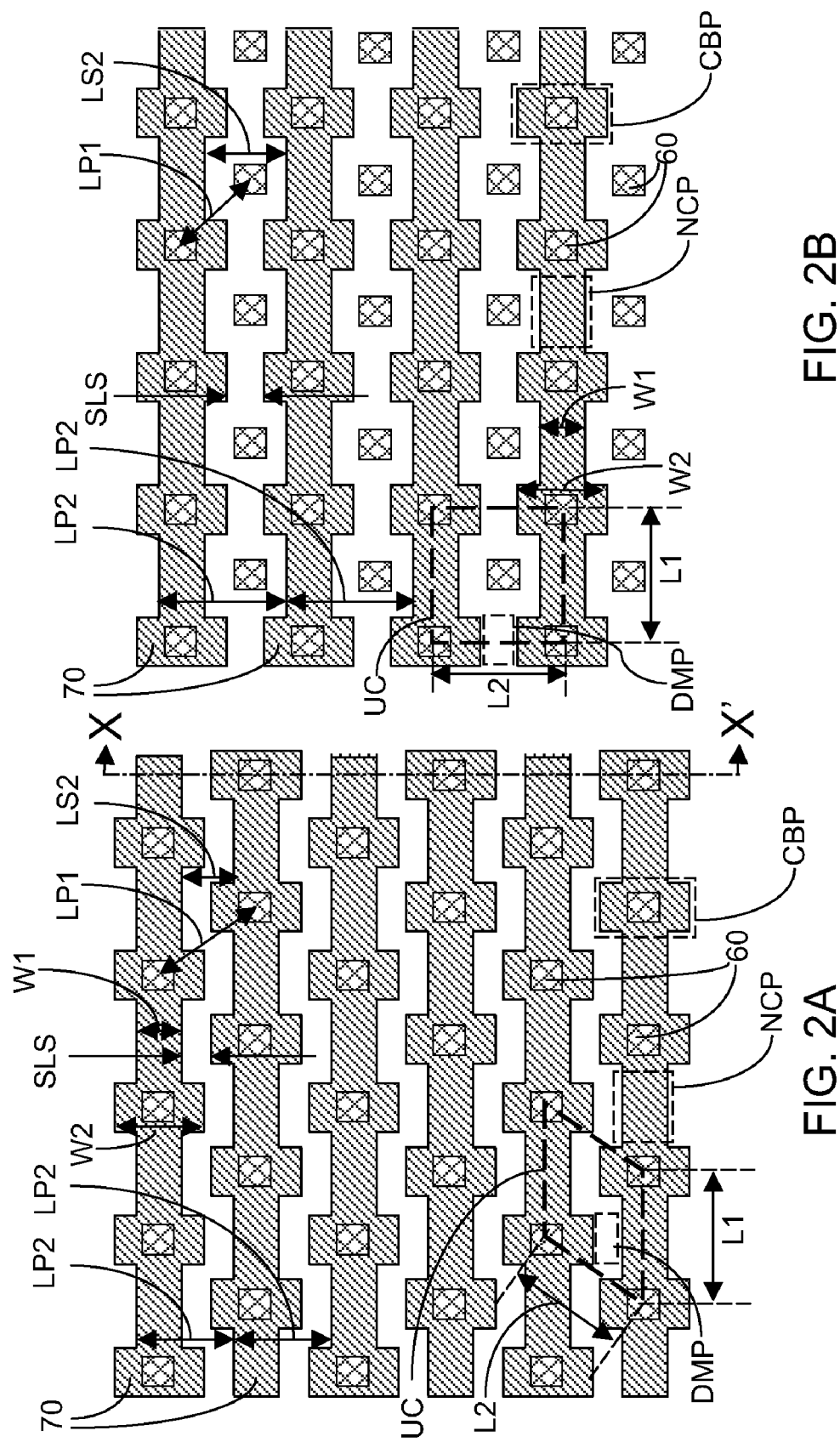

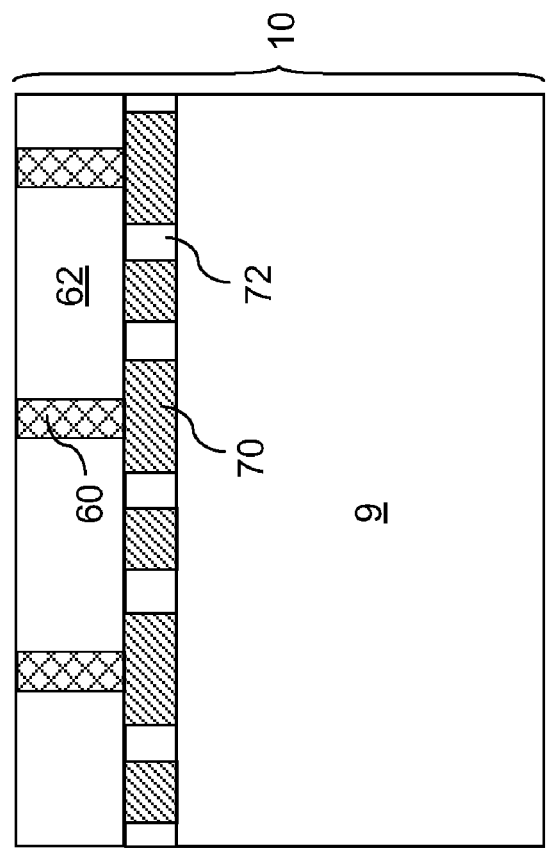
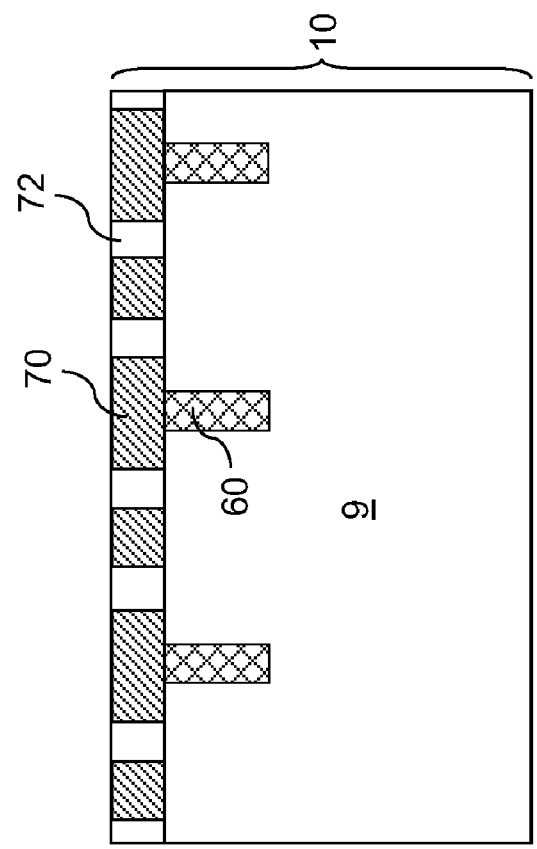
FIG. 3B
FIG. 3A

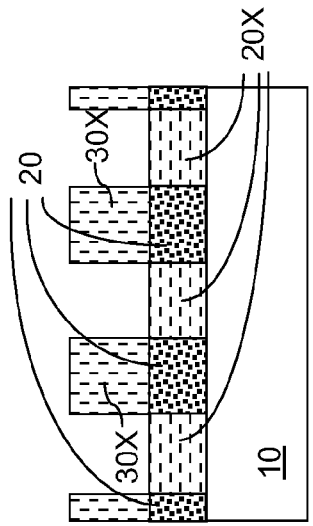
FIG. 6A
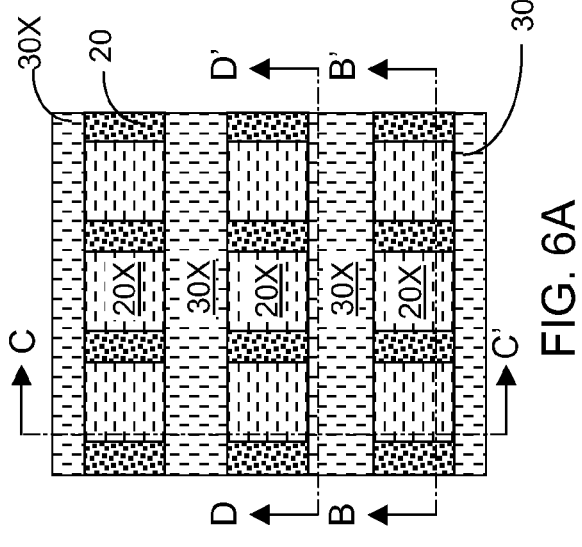
FIG. 6C
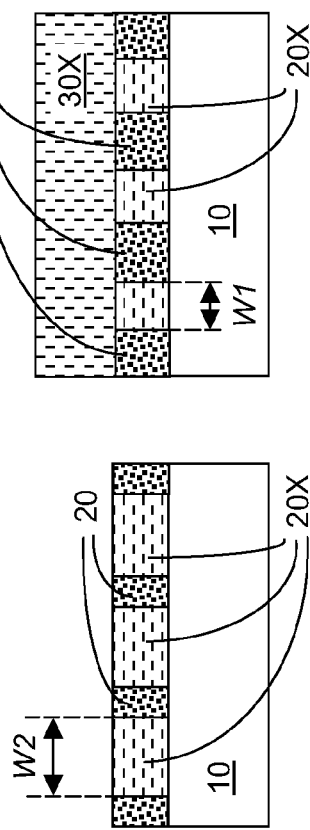
FIG. 6E
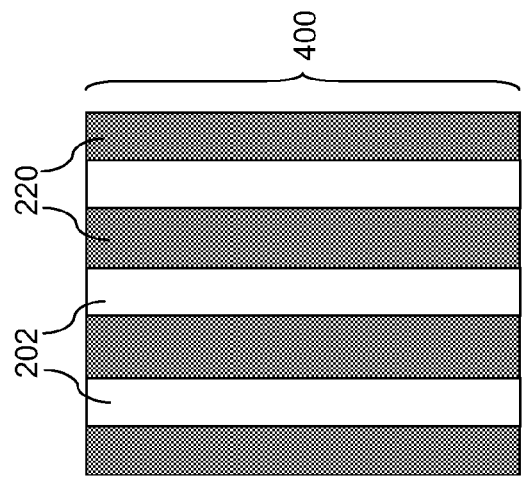
FIG. 6B
FIG. 6D

MULTI-EXPOSURE LITHOGRAPHY EMPLOYING DIFFERENTIALLY SENSITIVE PHOTORESIST LAYERS

FIELD OF THE INVENTION

The present invention relates to semiconductor processing methods, and particularly to methods for multi-exposure lithography employing a vertical stack of differentially sensitive photosensitive layers, and structures for effecting the same.

BACKGROUND OF THE INVENTION

Lithography is employed in semiconductor manufacturing to pattern features in a photoresist. A layer of photoresist is exposed to incident light, which may be deep-ultraviolet (DUV) radiation, mid-ultraviolet (MUV) radiation, or X-ray radiation. Alternately, the layer of photoresist may be exposed to energetic electron in e-beam lithography. The energy of the photons or electrons causes changes in chemical composition of exposed portions of the photoresist, for example, by cross-linkage, scission, side chain removal, etc. Pre-baking or post-baking of the photoresist may be employed to maximize the changes in the chemical properties of the exposed portion of the photoresist relative to unexposed portions of the photoresist.

The exposed photoresist is developed to remove one of the set of exposed portions of the photoresist and the set of unexposed portions of the photoresist relative to the other. The photoresist is classified as a positive photoresist or a negative photoresist depending on the nature of the chemical changes upon exposure. If the photoresist becomes chemically less stable upon exposure, the photoresist is a positive photoresist. If the photoresist becomes chemically more stable upon exposure, the photoresist is a negative photoresist. In case a positive photoresist is employed, the exposed portions of the positive photoresist are removed upon development. In case a negative photoresist is employed, the unexposed portions of the negative photoresist are removed upon development.

A developed photoresist comprises a lithographic pattern. The features of the lithographic pattern have dimensions that are the same as, or greater than, a "minimum feature size," which is also called a "critical dimension." The minimum feature size is a function of a lithography tool employed to form the lithographic pattern. The minimum feature size F that a projection system can print is given approximately by:

$$F = k \times \lambda / N_A,$$

where k is a coefficient that reflects tool specific proportionality constant reflecting the efficiency of the lithography system and other process related factors, $\lambda$ is the wavelength of the light employed for radiation, and $N_A$ is the numerical aperture of the lens. Typically, the value of the coefficient k is in the range of about 0.5.

While the minimum feature size is defined only in relation to a lithography tool and normally changes from generation to generation of semiconductor technology, it is understood that the minimum feature size, i.e., the critical dimension, is to be defined in relation to the best performance of lithography tools available at the time of semiconductor manufacturing. The minimum feature sizes include a minimum line width and a minimum line spacing for a nested line pattern, and a minimum via hole diameter for a nested via hole pattern. In general, the minimum feature sizes vary depending on the geometry of the features to be printed on a photoresist. Given geometry and given a specific lithography tool, however, minimum feature sizes are defined as a quantifiable number. Further, since the minimum achievable wavelength is determined by the type of the light source in commercially available lithography tools, for given geometry, the minimum feature sizes may be defined based on the technological capabilities at any given time. As of 2008, the minimum feature sizes are about 50 nm and are expected to shrink in the future. Any dimension less than the lithographic minimum dimension is called a "sublithographic dimension."

The pattern in the developed photoresist is subsequently transferred into an underlying layer employing the developed photoresist and an etch mask. Thus, the dimensions of features that may be formed in a semiconductor structure are directly tied to the dimensions of features in the developed photoresist. The minimum pitch of a repetitive lithographic pattern is the twice the minimum feature size since each unit pattern includes a line and a space or a via hole and a surrounding spacer.

Standard lithographic methods form patterns having lithographic dimensions, i.e., dimensions that are greater than the minimum feature size. Each generation of lithography tools thus impose a limitation on the width, spacing, and the pitch of a lithographic pattern. Such limitations are an inherent limit on the size of unit cells of an array of semiconductor devices. For example, static random access memory (SRAM) devices, dynamic random access memory (DRAM) devices, and flash memory devices employ an array of unit cells.

Such a unit cell typically employs features at or near the minimum feature size, which is enabled by the lithography tool employed in the manufacturing process. Frequently, the array of the unit cell employs a two-dimensional array of contact vias and a one dimensional array of conductive lines to maximize the wiring density. For example, the array of the unit cell may comprise a two-dimensional array of substrate contact vias, a one dimensional array of first metal lines, a two-dimensional array of first conductive vias above the first metal lines, a one dimensional array of second metal lines, etc.

An exemplary prior art wiring structure is shown in FIG. 1. The exemplary prior art wiring structure comprises an array of the unit cell, an array of contact vias 160, and an array of conductive lines 170. The conductive vias 160 may be located beneath the conductive lines 170, or above the conductive lines 170. The conductive vias 160 are arranged in a two-dimensional array so that the conductive vias 160 have a first lithographic pitch LP1', which is a pitch that may be formed by lithographic methods, and have a first lithographic spacing LS1', which is a spacing that may be formed by lithographic methods. The first lithographic spacing LS1' is the same as the first lithographic pitch LP1' less the dimension of a conductive via 160 in the direction of the measurement of the first lithographic pitch LP1'. The array of the conductive vias 160 may have another lithographic pitch in another direction, which may, or may not, be perpendicular to the direction of the first lithographic pitch LP1'. Likewise, the array of the conductive vias 160 may have another lithographic spacing in the other direction.

The conductive lines 170 are arranged in a one-dimensional array so that the conductive lines 170 have a second lithographic pitch LP2', which is a pitch that may be formed by lithographic methods, and have a second lithographic spacing LS2', which is a spacing that may be formed by lithographic methods. The second lithographic spacing LS2' is the same as the second lithographic pitch LP2' less the dimension of a conductive line 170 in the direction of the measurement of the second lithographic pitch LP2'. The first lithographic pitch LP1' and the second lithographic pitch LP2' are along the same direction and commensurate. Particularly, the first lithographic pitch LP1' and the second lithographic pitch LP2' are the same.

Successful fabrication of the exemplary semiconductor structures in FIG. 1 and fabrication of any wiring structure in general requires control of overlay in between the pattern of the conductive vias 160 and the conductive lines in the direction of the first lithographic pitch LP1'. Failure to control overlay between the printed pattern of the conductive vias 160 and the conductive lines 170 results in electrical short and/or electrical opens, rendering the array of semiconductor devices non-functional. "Overlay budget" for lithography is therefore one of the limiting factors in scaling semiconductor devices.

In view of the above, there exists a need for a method of forming wiring structures that provide greater overlay tolerance, and yet provide functional wiring for an array of semiconductor devices.

Further, there exists a need to locally manipulate lithographic images to increase overlay budget so that wiring density may be increased and scaling down of dimensions of semiconductor devices may be facilitated without risking electrical shorts or electrical opens.

SUMMARY OF THE INVENTION

The present invention provides methods of forming local manipulation of lithographic images in a conductive line so that a local bulge, which has a greater width than the width of the conductive line in neighboring portions, is formed in the portion of the conductive line which a contact via vertically abuts. Such a local bulge increases overlay budget in the lithography process, thereby facilitating scaling of dimensions below lithographic minimum feature dimensions.

In the present invention, a second photoresist having a second photosensitivity is formed on a substrate. A first photoresist having a first photosensitivity, which is greater than second photosensitivity, is formed on the second photoresist. A first pattern is formed in the first photoresist by a first exposure and a first development, while the second photoresist remains intact. A second pattern comprising an array of lines is formed in the second photoresist. An exposed portion of the second photoresist underneath a remaining portion of the first photoresist forms a narrow portion of a line pattern, while an exposed portion of the second photoresist outside the area of the remaining portions of the photoresist forms a wide portion of the line pattern. The overlap of the first pattern and the second pattern may be optimized so that each wide portions of the line pattern forms a bulge in the second pattern, so that the bulges in the second pattern coincide location of conductive vias beneath or above the line to be formed according to the second pattern. The bulges in the second pattern increases overlay tolerance between the second pattern and the pattern of the conductive vias.

According to an aspect of the present invention, a method of forming a patterned structure is provided, which comprises:
forming a stack of, from bottom to top, a second photoresist and a first photoresist on a substrate;
lithographically patterning the first photoresist with a first pattern, wherein a top surface of the second photoresist is exposed in an area of the first pattern; and
lithographically forming a second pattern in the second photoresist, wherein the second pattern includes a plurality of line troughs, wherein each of the plurality of line troughs includes a narrow portion having a first width, and wherein at least one of the plurality of line troughs includes a bulge portion having a second width greater than the first width, wherein the bulge portion is formed underneath the area of the first pattern.

In one embodiment, the second photoresist has a second photosensitivity and the first photoresist has a first photosensitivity, and wherein the first photosensitivity is greater than the second photosensitivity.

In another embodiment, the second pattern is formed by simultaneously lithographically exposing the first photoresist having the first pattern and the second photoresist with a light exposure pattern generated by a lithographic mask containing a pattern of a set of parallel lines of a constant width.

In yet another embodiment, the method further comprises:
transferring the second pattern into the substrate by etching, wherein the second pattern is replicated in an upper surface of the substrate; and
forming a plurality of conductive lines embedded in the substrate, wherein each of the plurality of conductive lines includes a narrow conductive portion having a third width, and wherein at least one of the plurality of conductive lines includes a conductive bulge portion having a fourth width greater than the third width.

According to another aspect of the present invention, a patterned structure is provided, which comprises:
at least one exposed second photoresist portion located on a substrate and laterally abutted by at least one second photoresist portion, wherein the at least one second photoresist portion comprises a second unexposed photosensitive material and the at least one exposed second photoresist portion comprises a second exposed photosensitive material, wherein the second exposed photoresist material is a material derived from the second unexposed photoresist material by lithographic exposure, i.e., an exposed portion of a second photoresist constitutes the second exposed photoresist material and an unexposed portion of the second photoresist constitutes the second unexposed photoresist material; and
at least one exposed first photoresist portion located directly on the at least one exposed second photoresist portion and the at least one second photoresist portion and comprising a first exposed photosensitive material.

In one embodiment, the first exposed photoresist material is a material derived from a first unexposed photoresist material by lithographic exposure, and the first unexposed photoresist material has a first photosensitivity and the second unexposed photosensitive material has a second photosensitivity, and wherein the first photosensitivity is greater than the second photosensitivity.

According to yet another aspect of the present invention, a patterned structure is provided, which comprises a plurality of conductive lines embedded in a substrate, arranged in a periodic array, and separated by an insulating material therebetween, wherein each of the plurality of conductive lines includes a narrow conductive portion having a first width, and wherein at least one of the plurality of conductive lines includes a conductive bulge portion having a second width greater than the first width, and wherein the conductive bulge portion is separated from a neighboring conductive line by a sublithographic spacing.

In one embodiment, the conductive bulge portion is separated by the sublithographic spacing from a narrow conductive portion in the neighboring conductive line.

In another embodiment, the conductive bulge portion is separated by the sublithographic spacing from another conductive bulge portion in the neighboring conductive line.

In yet another embodiment, the plurality of conductive lines comprises a two-dimensional array of a unit cell structure having a horizontal cross-sectional area of a parallelogram or a rectangle.

In still another embodiment, a first length of a first side of the parallelogram or the rectangle is a distance between a neighboring pair of conductive bulge portions along a lengthwise direction of the plurality of conductive lines, and a second length of the second side of the parallelogram or the rectangle is a distance between another neighboring pair of the conductive bulge portions located in neighboring conductive lines.

In even another embodiment, the patterned structure further comprises an array of conductive vias in another two dimensional array having another unit cell structure having a same horizontal cross-sectional area as the unit cell structure.

In a further embodiment, the unit cell structure comprises a dielectric material portion having a constant width of the sublithographic spacing and laterally abutted by a pair of the plurality of conductive lines.

BRIEF DESCRIPTION OF THE DRAWINGS

FIG. 1 is a see-through top-down view of an exemplary prior art wiring structure having a first prior art array of conductive vias 160 and conductive lines 170.

FIG. 2A is a see-through top-down view of a first exemplary wiring structure having a first array of conductive vias 60 and conductive lines 70 according to the present invention. FIG. 2B is a see-through top-down view of a second exemplary wiring structure having a second array of conductive vias 60 and conductive lines 70 according to the present invention.

FIG. 3A is a vertical cross-sectional view of the first exemplary wiring structure along the plane X-X' in FIG. 2A. FIG. 3B is a vertical cross-sectional view of a third exemplary wiring structure along a plane corresponding the plane X-X' in FIG. 2A. A see-through top-down view of the third exemplary wiring structure is the same as the see-through top-down view of the first exemplary wiring structure in FIG. 2A.

FIG. 4A is a top-down view, FIG. 4B is a vertical cross-sectional view along the plane B-B' in FIG. 4A, and FIG. 4C is a vertical cross-sectional view along the plane C-C' in FIG. 4A.

FIG. 5A is a top-down view, FIG. 5B is a vertical cross-sectional view along the plane B-B' in FIG. 5A, and FIG. 5C is a vertical cross-sectional view along the plane C-C' in FIG. 5A.

FIGS. 6A, 6B, 6C, and 6D are views of the first exemplary lithographic structure at a step after a second exposure. FIG. 6A is a top-down view, FIG. 6B is a vertical cross-sectional view along the plane B-B' in FIG. 6A, FIG. 6C is a vertical cross-sectional view along the plane C-C' in FIG. 6A, and FIG. 6D is a vertical cross-sectional view along the plane D-D' in FIG. 6A.

FIG. 6E is a top-down view of a second lithographic mask employed for the second exposure.

FIG. 6A is a top-down view, FIG. 6B is a vertical cross-sectional view along the plane B-B' in FIG. 6A, and FIG. 6C is a vertical cross-sectional view along the plane C-C' in FIG. 6A.

FIG. 8A is a top-down view, FIG. 8B is a vertical cross-sectional view along the plane B-B' in FIG. 8A, and FIG. 8C is a vertical cross-sectional view along the plane C-C' in FIG. 8A.

FIG. 9A is a top-down view, FIG. 9B is a vertical cross-sectional view along the plane B-B' in FIG. 9A, and FIG. 9C is a vertical cross-sectional view along the plane C-C' in FIG. 9A.

FIG. 10A is a top-down view, FIG. 10B is a vertical cross-sectional view along the plane B-B' in FIG. 10A, and FIG. 10C is a vertical cross-sectional view along the plane C-C' in FIG. 10A.

FIG. 11A is a top-down view, FIG. 11B is a vertical cross-sectional view along the plane B-B' in FIG. 11A, and FIG. 11C is a vertical cross-sectional view along the plane C-C' in FIG. 11A.

DETAILED DESCRIPTION OF THE INVENTION

Figure 4C:
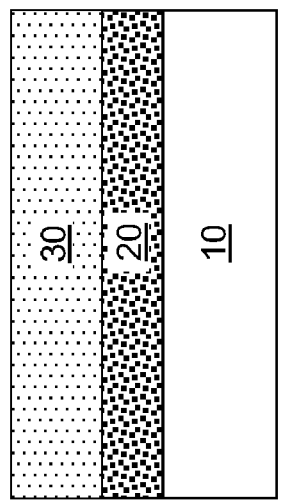
FIGS. 4A, 4B, and 4C are views of a first exemplary lithographic structure that may be employed to form the first, second, or third exemplary wiring structure at a step after application of a second photoresist 20 and a first photoresist 30.

As stated above, the present invention relates to methods for multi-exposure lithography employing a vertical stack of differentially sensitive photosensitive layers, and structures for effecting the same, which are now described in detail with accompanying figures. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Referring to FIGS. 2A, 2B, 3A, and 3B, a first exemplary wiring structure, a second exemplary wiring structure, and a third exemplary wiring structure are shown according to the present invention. Specifically, FIG. 2A is a see-through top-down view of the first exemplary wiring structure having a first array of conductive vias 60 and conductive lines 70. FIG. 2B is a see-through top-down view of the second exemplary wiring structure having a second array of conductive vias 60 and conductive lines 70. FIG. 3A is a vertical cross-sectional view of the first exemplary wiring structure along the plane X-X' in FIG. 2A. FIG. 3B is a vertical cross-sectional view of the third exemplary wiring structure along a plane corresponding the plane X-X' in FIG. 2A. A see-through top-down view of the third exemplary wiring structure is the same as the see-through top-down view of the first exemplary wiring structure of FIG. 2A.

Each of the first, second, and third exemplary wiring structures comprises a substrate 10 in which a plurality of conductive lines 70 is embedded. Each of the conductive lines 70 comprises a conductive material such as a metal or a doped semiconductor material. The plurality of conductive lines 70 may be arranged in a periodic array. Each of the conductive lines 70 is separated by an insulating material portion 72. Each of the plurality of conductive lines includes a narrow conductive portion NCP having a first width W1. At least one of the plurality of conductive lines 70 includes a conductive bulge portion CBP having a second width W2, which greater than the first width W1.

A plurality of conductive vias 60 is also embedded in the substrate 10. Each of the conductive vias 60 comprises a conductive material such as a metal or a doped semiconductor material. The plurality of conductive vias 60 may be arranged in a periodic array. The plurality of conductive vias 60 may be located directly on top surfaces of the conductive lines 70 as shown in FIG. 3B, or may be located directly beneath bottom surfaces of the conductive lines 70 as shown in FIG. 3A. The entirety of the plurality of conductive vias 60 may abut the plurality of conductive lines 70 as exemplified in FIG. 2A, or a first subset of the plurality of conductive vias 60 may abut the plurality of conductive lines 70, while a second subset of the plurality of conductive vias 60 do not abut the plurality of conductive lines as exemplified in FIG. 2B.

The substrate 10 may include a semiconductor-device-containing substrate 9 including at least one semiconductor device. The plurality of conductive vias 60 may be formed within the semiconductor-device-containing substrate 9, or may be formed in a via-level dielectric layer 62 as embedded structures.

In one embodiment, the plurality of conductive lines 70 comprises a two-dimensional array of a unit cell structure UC having a horizontal cross-sectional area of a parallelogram or a rectangle. Specifically, the unit cell structure in the first and third exemplary wiring structures is a parallelogram which is not a rectangle as shown in FIG. 2A. The unit cell structure UC in the second exemplary wiring structure is a rectangle as shown in FIG. 2B. A pattern including a narrow conductive portion NCP and a conductive bulge portion CBP is repeated within each of the plurality of conductive lines 70 with a periodicity of a first length L1, which is the length of a first side of the parallelogram or the rectangle. In other words, the periodicity of the unit cell structure UC in a lengthwise direction of the plurality of conductive lines 70 is a distance between a neighboring pair of conductive bulge portions CBP within the same conductive line 70. The pattern including the narrow conductive portion NCP and the conductive bulge portion CBP is also repeated among the plurality of conductive lines 70 with a periodicity of a second length L2, which is the length of a second side of the parallelogram or the rectangle between a neighboring pair of the conductive bulge portions CBP which are located in a neighboring pair of conductive lines 70.

The plurality of conductive vias 60 may also comprise a two-dimensional array. A unit cell structure of the array of the plurality of conductive vias 60 may have the same horizontal cross-sectional area the unit cell structure. Particularly, the location of each conductive via 60 may substantially coincide with a geometric center of one of the conductive bulge portions CBP in the array of the conductive lines 70 so that the entirety of the conductive vias 60 abutting the plurality of conductive lines 70 is confined within the boundaries of the conductive lines in a see-through top-down view.

According to the present invention, each of the conductive bulge portion CBP is separated from a neighboring conductive line 70 by a sublithographic spacing SLS. Particularly, the unit cell structure UC comprises a dielectric material portion DMP having a constant width of the sublithographic spacing SLS and laterally abutted by a pair of the plurality of conductive lines 70.

In the case of the first exemplary wiring structures shown in FIG. 2A, a dielectric material portion DMP having the sublithographic spacing SLS separates a conductive bulge portion CBP from a narrow conductive portion NCP in a neighboring conductive line 70. Thus, the sublithographic spacing SLS is formed between the conductive bulge portion CBP and the narrow conductive portion NCP.

In the case of the second exemplary wiring structure shown in FIG. 2B, a dielectric material portion DMP having the sublithographic spacing SLS separates a pair of conductive bulge portions CBP belonging to a neighboring pair of conductive lines 70. Thus, a conductive bulge portion CBP in a conductive line 70 is separated by the sublithographic spacing SLS from another conductive bulge portion CBP in the neighboring conductive line 70.

As will be subsequently described, the width of each narrow conductive portion NCP, i.e., the first width W1, is a lithographic line width, which is at least a minimum lithographic width of a nested line pattern generated by a lithography tool employed to pattern the narrow conductive portions NCP. The spacing between a neighboring pair of narrow conductive portions NCP, which is herein referred to as a second lithographic spacing LS2, is a lithographic spacing, which is at least a minimum lithographic spacing of the nested line pattern generated by the lithography tool employed to pattern the narrow conductive portions NCP. The sum of the first width W1 and the second lithographic spacing LS2, which is the sum of the lithographic line width and the lithographic spacing of the nested line pattern generated by the lithography tool employed to pattern the narrow conductive portions NCP, is the lithographic pitch of the nested line pattern generated by the lithography tool, and is herein referred to as a second lithographic pitch LP2. The first width W1 may be the lithographic minimum width, which is the minimum width that may be obtained with the lithography tool for nested line patterns. Likewise, the second lithographic spacing LS2 may be the lithographic minimum spacing, which is the minimum spacing that may be obtained with the lithography tool for nested line patterns.

The sublithographic spacing SLS may be the second lithographic pitch LP2 less the second width W2, i.e., the width of a conductive bulge portion CBP. Since the second lithographic pitch LP2 is equal to the sum of the width of each narrow conductive portion NCP and the spacing between a neighboring pair of narrow conductive portions NCP, the sublithographic spacing SLS may be equal to the sum of the first width W1 and the second lithographic spacing LS2 less the second width W2. The width of the conductive bulge portion CBP, i.e., the second width W2, is not determined by lithographic limitations of a single exposure, but is determined by a combination of two exposures employing a stack of two photoresists. Consequently, the sublithographic spacing SLS is not limited by any single lithographic process, thereby being a "sublithographic" spacing having a dimension less than the minimum lithographic spacing imposed by the limitations of geometry and the lithography tool employed to form the nested line pattern of the narrow conductive portions NCP.

In case the plurality of conductive vias 60 comprises a two-dimensional array, the pitch of the two-dimensional array is herein referred to as a first lithographic pitch LP1. The direction of the first lithographic pitch LP1 may be different from the direction of the second lithographic pitch LP2. The conductive vias 60 belonging to a neighboring row are offset from the conductive vias 60 in a row by half of the first length L1, i.e., half the periodicity of the unit cell structure UC in the lengthwise direction of the conductive lines 70. Such offset enables dense packing of conductive vias 60 and conductive lines 70.

Preferably, lateral dimensions of each of the conductive bulge portions CBP in the conductive lines 70 are selected such that edges of the conductive vias 60 are located within the conductive bulge portions CBP even with overlay variation. In other words, the cross-sectional areas of the conductive vias 60, which are designed to be placed on or under the conductive lines 70, are confined within the cross-sectional areas of the conductive lines even after lateral displacement of the conductive vias 60 within the limits of the overlay budget necessarily involved in fabrication of the conductive lines 70 and the conductive vias 60. Thus, the conductive bulge portions CBP enable scaling of dimensions in the direction of the second width W2, i.e., in the direction perpendicular to the lengthwise direction of the conductive lines 70.

Figure 4A:
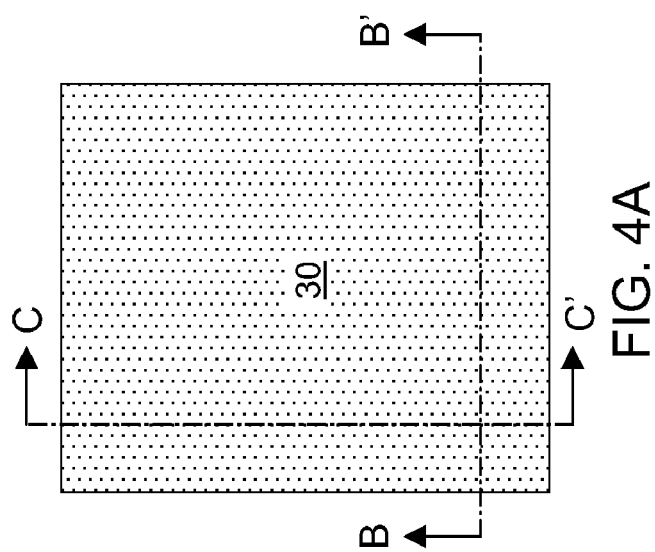
Figure 4B:
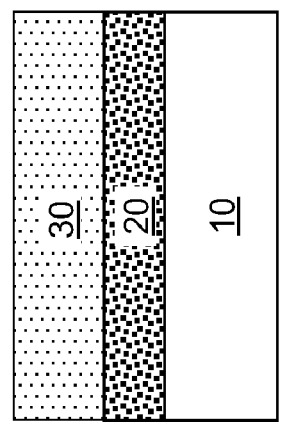

Referring to FIGS. 4A, 4B, and 4C, a first exemplary lithographic structure is shown, which may be employed to form the first, second, or third exemplary wiring structure. FIG. 4A is a top-down view, FIG. 4B is a vertical cross-sectional view along the plane B-B' in FIG. 4A, and FIG. 4C is a vertical cross-sectional view along the plane C-C' in FIG. 4A. The first exemplary lithographic structure comprises a substrate 10, which may be a semiconductor substrate including at least one semiconductor device (not shown). The substrate 10 may, or may not, include at least one metal interconnect layer, each of which comprises a dielectric layer and a conductive wiring. A layer of a second photoresist 20 is applied on the substrate 10, for example, by spin coating. A layer of a first photoresist 30 is applied on the top surface of the second photoresist 20 after stabilizing the layer of the second photoresist 20, for example, by a prebake.

The second photoresist 20 has a second photosensitivity and the first photoresist 30 has a first photosensitivity at least over a wavelength range for lithographic exposure. The first photosensitivity is greater than the second photosensitivity, i.e., the first photoresist 30 may be developed with less lithographic exposure to light than the second photoresist 20. The vertical stack of the second photoresist 20 and the first photoresist 30 comprises differentially sensitive photoresist layers, i.e., photoresist layers having different photosensitivity.

The second photoresist 20 may be a typical deep ultraviolet (DUV) photoresist, a typical mid-ultraviolet (MUV) photoresist, a typical extreme ultraviolet (EUV), or a typical electron beam resist.

The first photoresist 30 comprises a material that absorbs light at the imaging wavelength of the second photoresist 20, and thus blocks light associated with side lobe printing during from reaching the second photoresist 20. It is preferred that the first photoresist 30 has an absorption parameter k greater than the absorption parameter of the second photoresist 20 at the imaging wavelength of the second photoresist 20. The absorption parameter k indicates the amount of absorption loss when an electromagnetic wave propagates through a material, such as a photoresist. The absorption parameter of the first photoresist 30 is preferably in the range from about 0.05 to about 0.8, more preferably in the range from about 0.08 to about 0.5 at the imaging wavelength of the second photoresist 20.

The differential photosensitivity across the first photoresist 30 and the second photoresist 20 may be effected by employing different photosensitive chemicals across the first photoresist 30 and the second photoresist 20. In this case, the first photoresist 20 comprises a first photosensitive chemical and the second photoresist 20 comprises a second photosensitive chemical. The first photosensitive chemical has greater photosensitivity than the second photosensitive chemical.

The material of the first photoresist 30 that is employed in the present invention includes, but is not limited to, a composition referred to as a "grey resist." A grey resist includes a resist polymer with an absorbing moiety. The absorbing moiety of the resist polymer of the grey resist may be any chemical moieties that absorb radiation at the exposure wavelength. Preferably, the absorbing moiety includes, but is not limited to, unsubstituted and substituted aromatic moieties such as benzene, naphthalene, hydroxy-substituted benzene, and hydroxy-substituted naphthalene. Examples of resist polymers for the grey resist include polymers containing polycyclic moieties commonly used in 193 nm photoresists and phenol groups commonly used in 248 nm photoresists. The grey resist is selected to be photoimageable at the same wavelength of light as the second photoresist 20, and is also developable with an aqueous base developing solution typically used to develop the second photoresist 20. In addition to the resist polymer, the grey resist further comprises a photoacid generator and a solvent. Preferably, the grey resist also contains a quencher.

In a preferred embodiment, the first photoresist 30 is a positive photoresist that becomes chemically less stable upon lithographic exposure to light. The second photoresist 20 is another positive photoresist that becomes chemically less stable upon exposure.

The thickness of the second photoresist 20 may be from about 50 nm to about 600 nm, and typically from about 100 nm to about 300 nm, although lesser and greater thicknesses are also contemplated herein. The thickness of the first photoresist 30 may be from about 5 nm to about 200 nm, and typically from about 10 nm to about 100 nm, although lesser and greater thicknesses are also contemplated herein.

Figure 5C:
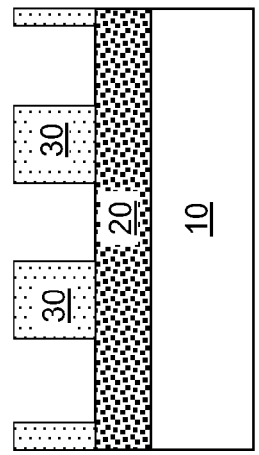
FIGS. 5A, 5B, and 5C are views of the first exemplary lithographic structure at a step after formation of a first pattern in the first photoresist 30.
Figure 5D:
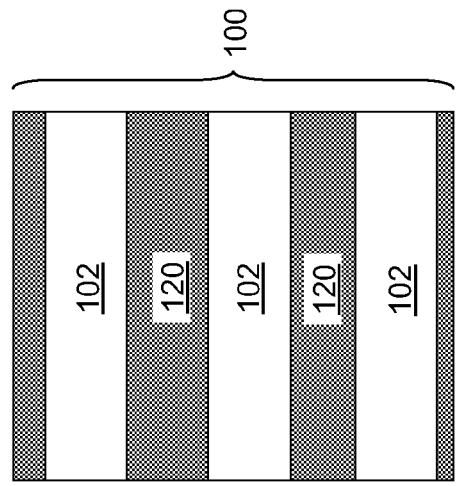
FIG. 5D is a top-down view of a first lithographic mask employed to expose the first photoresist 30 to form the first pattern in the first photoresist 30.
Figure 5A:
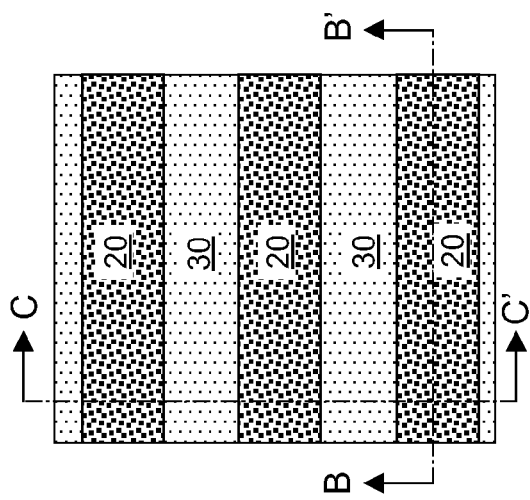
Figure 5B:
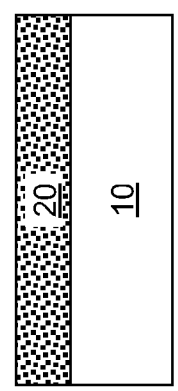

Referring to FIGS. 5A, 5B, and 5C, the first photoresist 30 is exposed and developed to form a first pattern including line troughs. The steps of the exposure and the development of the first photoresist 30 are herein referred to a first exposure and a first development. A top surface of the second photoresist 20 is exposed in an area of the first pattern, i.e., in the area of the line troughs. For the purpose of description of the present invention, the lengthwise direction of the line troughs in the first photoresist 30 is herein referred to as a "horizontal direction." The direction perpendicular to the horizontal direction is herein referred to as a "vertical direction." It is noted that the first exemplary lithographic structure may be rotated in any arbitrary azimuthal angle and that the designation of "horizontal" and "vertical" directions is only for convenience in describing the present invention.

The first pattern may include line troughs in the horizontal direction. In this case, a first lithographic mask 100, shown in FIG. 5D and having a pattern of nested lines running in the horizontal direction, may be employed to expose the first photoresist 30, thereby forming the first pattern in the first photoresist 30. Specifically, the first lithographic mask 100, which is loaded into a lithography tool and placed in the optical path of light during the first exposure, comprises a nested array of transparent portions 102 interlaced with a nested array of opaque portions 120. The location of horizontal troughs corresponds to locations at which conductive bulge portions are to be subsequently formed on a line trough along vertical directions. The width of the line troughs in the first photoresist 30 is a lithographic width, i.e., a dimension limited by lithography and is at least a minimum lithographic width of the lithography tool employed to generate the first pattern. The spacing between a neighboring pair of line troughs is a lithographic spacing, i.e., a dimension limited by lithography and is at least a minimum lithographic spacing of the lithography tool employed to generate the first pattern.

After the first exposure and the first development, the first photoresist 30 is patterned so that top surfaces of the second photoresist 20 are exposed underneath the line troughs. The second photoresist 20, which is less sensitive than the first photoresist 30, remains substantially intact, i.e., the entirety of the second photoresist 20 remains throughout the first exposure and the first development.

Referring to FIGS. 6A, 6B, 6C, and 6D, the remaining portion of the first photoresist 30 and the second photoresist 20 in the first exemplary lithographic structure are exposed. The step of the exposure of the remaining portions of the first photoresist 30 and the second photoresist 20 is herein referred to a second exposure. The entirety of the remaining portions of the first photoresist is exposed sufficiently to enable removal during a subsequent development step, which is herein referred to as a second development step, and is herein referred to as exposed first photoresist portions 30X. The portions of the second photoresist that are sufficiently exposed to enable removal during the second development are herein referred to as exposed second photoresist portions 20X. The second photoresist 20 in FIGS. 6A, 6B, 6C, and 6D refers to the portions of the material of the second photoresist 20, which maintains the chemical properties of the second photoresist 20 prior to the second exposure due to insufficient exposure or lack of exposure to light.

Specifically, the remaining portion of the first photoresist 30, which has the first pattern, and the second photoresist 20 are simultaneously lithographically exposed with a light exposure pattern generated by a second lithographic mask 200, which is shown in FIG. 6E and contains a pattern of a set of parallel lines of a constant width. The second lithographic mask 200, which is loaded into a lithography tool and placed in the optical path of light during the second exposure, comprises a nested array of transparent portions 202 interlaced with a nested array of opaque portions 220. The set of parallel lines run in the vertical direction, which is perpendicular to the direction of line troughs in the first pattern.

The light exposure pattern generated by the second lithographic mask 200 has a modulation of light intensity in a direction perpendicular to the set of parallel lines, i.e., in the horizontal direction corresponding to the pattern of vertical lines in the second lithographic mask 200. Due to the wave properties of light and imperfections in the optical properties of the material employed in the transparent portions 202 and the opaque portions 220, however, light intensity is non-zero throughout an exposure filed, which includes the entirety of the first exemplary lithographic structure. In other words, the intensity of light impinging on the remaining portions of the first photoresist 30 does not have a square waveform having zero intensity regions between non-zero intensity regions, but have a continuously modulating waveform which is non-zero throughout the field of the exposure. Since the first photosensitivity, i.e., the sensitivity of the first photoresist 30, is greater than the second photosensitivity, i.e., the sensitivity of the second photoresist 20, the entirety of the first photoresist 30 having the first pattern is exposed during the second exposure to be converted to the exposed first photoresist portions 30X.

Unlike the first photoresist 30, the second photoresist is exposed only in regions illuminated with sufficient light intensity since the second photosensitivity is lower than the first photosensitivity. The since the first photoresist 30 absorbs and blocks light to an underlying portion of the second photoresist 20, the regions of the second photoresist 20 underlying the line troughs between the remaining portions of the first photoresist 30 (See FIGS. 5A and 5C) is exposed more than the regions of the second photoresist 20 underlying the remaining portions of the first photoresist 30. Thus, the exposed second photoresist portions 20X have a patterned including a plurality of vertical line troughs having two widths, a first width W1 and a second width W2. The regions of the exposed second photoresist portions 20X having the first width W1 underlie the exposed first photoresist portions 30X. The regions of the exposed second photoresist portions 20X having the second width W2 overlaps with the area of the horizontal line troughs between the remaining portions of the first photoresist 30 after the first development (See FIG. 5A). In other words, the top surfaces of the regions of the exposed second photoresist portions 20X having the second width W2 are not covered by the exposed first photoresist portions 30X.

Figure 7C:
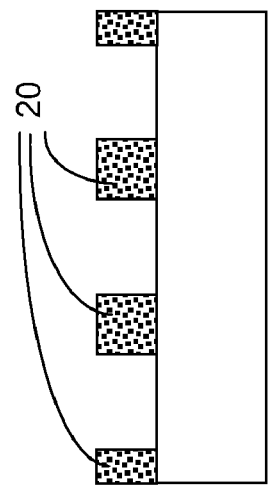
FIGS. 7A, 7B, and 7C are views of the first exemplary lithographic structure at a step after formation of a second pattern in the second photoresist 20.
Figure 7A:
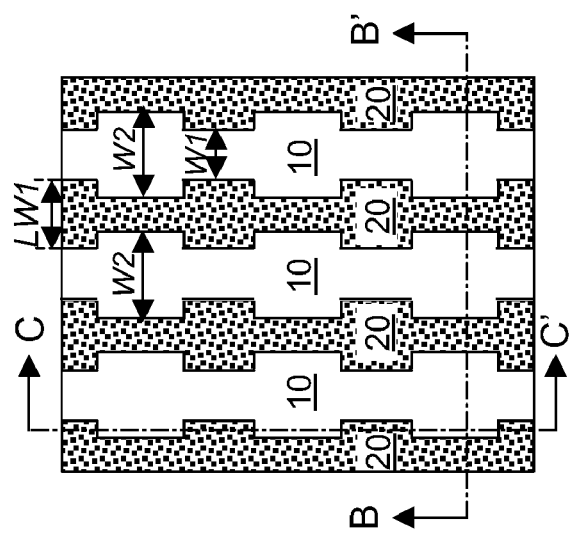
Figure 7B:
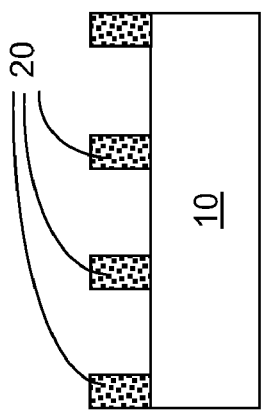

Referring to FIGS. 7A, 7B, and 7C, the exposed second photoresist portions 20X and the exposed first photoresist portions 30X are developed. The step of the development of the exposed second photoresist portions 20X and the exposed first photoresist portions 30X is the second development. As the exposed second photoresist portions 20X is removed, no portion of the first photoresist 30 remains on the first exemplary lithographic structure, i.e., the entirety of the first photoresist 30 is removed from the first exemplary lithographic structure. Further, all of the regions of the exposed second photoresist portions 20X, including regions having the first width W1 and the second width W2, are removed during the second development.

The second pattern includes a plurality of line troughs running in the vertical direction, i.e., in the direction perpendicular to the direction of the line troughs in the first pattern in the remaining portion of the first photoresist 20 prior to removal thereof. Each of the plurality of line troughs includes a narrow portion having a first width W1, which corresponds to the first width W1 of the first and second exemplary wiring structures of FIGS. 2A and 2B. Specifically, upon a subsequent transfer of the second pattern into the substrate 10 to form line troughs located in an upper portion of the substrate 10 and having substantially the same cross-sectional area 10 as the line troughs in the second photoresist and filling of the line troughs in the substrate 10, conductive lines 70 of FIGS. 2A, 2B, 3A, and/or 3B may be formed, which includes narrow conductor portions NCP having a width that is substantially the same as the first width W1.

Further, at least one of the plurality of line troughs includes a bulge portion having a second width W2, which corresponds to the second width W2 of the first and second exemplary wiring structures of FIGS. 2A and 2B. Specifically, upon a subsequent transfer of the second pattern into the substrate 10 to form line troughs in an upper portion of the substrate 10 as described above, conductive lines 70 (See FIGS. 2A, 2B, 3A, 3B) including conductive bulge portions CBP having a width that is substantially the same as the second width W2 are formed. The second width w2 is greater than the first width W1. The location of each bulge portion in the line troughs coincides with the area of the line troughs in the first pattern.

The width of the narrow portions of the vertical line troughs in the second photoresist 20, i.e., the first width W1, is a lithographic width, of which the dimension is limited by lithography and is at least a minimum lithographic spacing of the lithography tool employed to generate the second pattern. The spacing between a neighboring pair of wide portions of the vertical line troughs in the second photoresist, i.e., the distance between two neighboring line trough portions having the second width W2, may be a sublithographic width, which is less than the minimum line width for nested line structures. The portions of the second photoresist 20 between neighboring pairs of line trough portions having the second width W2 are supported by portions of the second photoresist 20 having a greater width and located between line trough portions having the first width W1. Due to such lateral structural support, the distance between a neighboring pair of line trough portions having the second width W2 may be a sublithographic dimension, which may not be achieved in nested line and space structures due to lack of lateral support, i.e., a straight line photoresist portion having such a sublithographic distance as a line width would fall for lack of lateral support. The width of the portions of the second photoresist 20 between a pair of neighboring narrow line trough portions having the first width W1 is a first lithographic width LW1, which may be substantially the same as the second lithographic spacing LS2 in FIGS. 2A and 2B.

The first exemplary lithographic structure and/or variations of the first exemplary lithographic structure may be employed to form the first, second, or third exemplary wiring structure of FIGS. 2A, 2B, 3A, and/or 3B. For this purpose, the second pattern is transferred into the substrate 10 by an etch, which is typically an anisotropic ion etch that employs the second photoresist 20 as an etch mask. The second pattern is replicated in an upper surface of the substrate 10. The second photoresist 20 is subsequently removed.

A conductive material is filled in the line troughs formed in the upper portion of the substrate 10, and is subsequently planarized to form a plurality of conductive lines 70 (See FIGS. 2A, 2B, 3A, 3B) embedded in the substrate 10. Each of the plurality of conductive lines 70 includes a narrow conductive portion NCP having the third width, which may be substantially the same as the first width W1. Further, at least one of the plurality of conductive lines 70 includes a conductive bulge portion CBP having a fourth width, which may be substantially the same as the second width W2. The fourth width is greater than the third width.

Figure 8C:
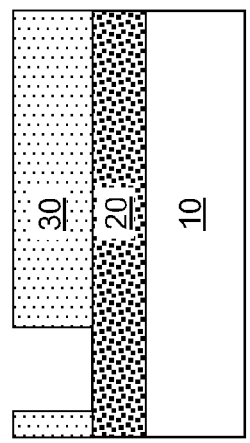
FIGS. 8A, 8B, and 8C are views of a second exemplary lithographic structure at a step after formation of a first pattern in a first photoresist 30.
Figure 8D:
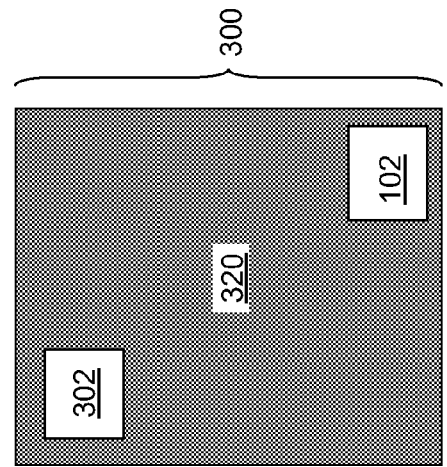
FIG. 8D is a top-down view of a third lithographic mask employed to expose the first photoresist 30 to form the first pattern in the first photoresist 30.
Figure 8A:
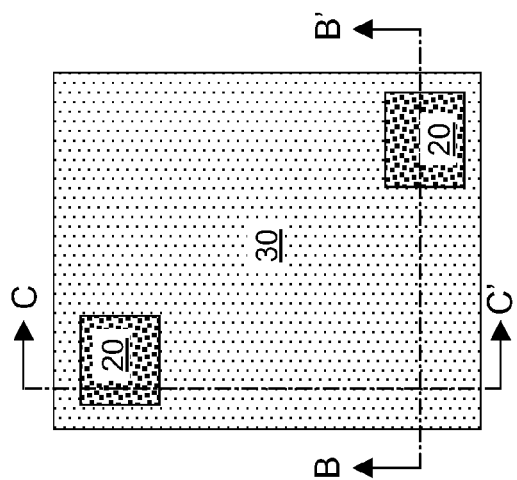
Figure 8B:
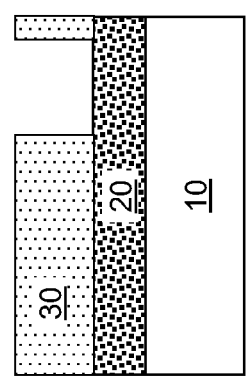

Referring to FIGS. 8A, 8B, and 8C, a second exemplary lithographic structure is derived from the first exemplary lithographic structure of FIGS. 4A, 4B, and 4C. In the second exemplary lithographic structure, the first photoresist 30 is exposed and developed to form a first pattern including cavities. The steps of the exposure and the development of the first photoresist 30 are herein referred to a first exposure and a first development. A top surface of the second photoresist 20 is exposed in an area of the first pattern, i.e., in the area of the cavities.

A third lithographic mask 300 shown in FIG. 8D may be employed to expose the first photoresist 30, thereby forming the first pattern in the first photoresist 30. Specifically, the third lithographic mask 300, which is loaded into a lithography tool and placed in the optical path of light during the first exposure, comprises isolated transparent portions 302 embedded in an opaque portion 320. The location of the isolated transparent portions corresponds to locations at which conductive bulge portions are to be subsequently formed on a line trough along vertical directions. The width of the cavities in the first photoresist 30 is a lithographic width, i.e., a dimension limited by lithography and is at least a minimum lithographic width of the lithography tool employed to generate the first pattern.

After the first exposure and the first development, the first photoresist 30 is patterned so that top surfaces of the second photoresist 20 are exposed underneath the cavities. The second photoresist 20, which is less sensitive than the first photoresist 30, remains substantially intact, i.e., the entirety of the second photoresist 20 remains throughout the first exposure and the first development.

Figure 9C:
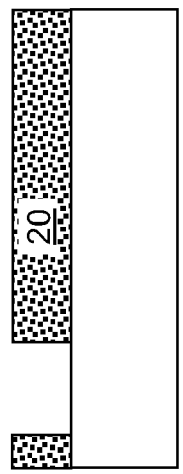
FIGS. 9A, 9B, and 9C are views of the second exemplary lithographic structure at a step after formation of a second pattern in the second photoresist 20.
Figure 9D:
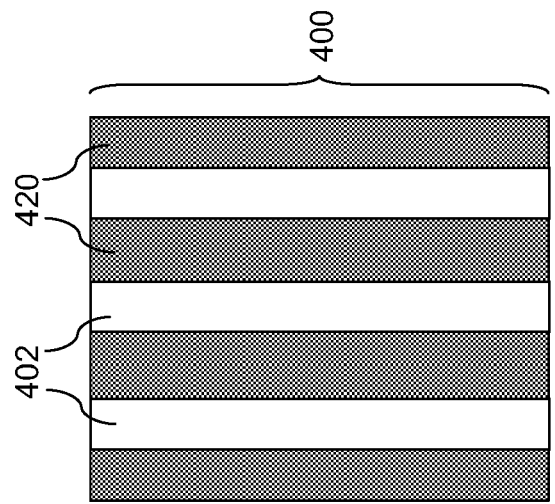
FIG. 9D is a top-down view of a fourth lithographic mask employed to expose remaining portions of the first photoresist 30 and the second photoresist 20.
Figure 9A:
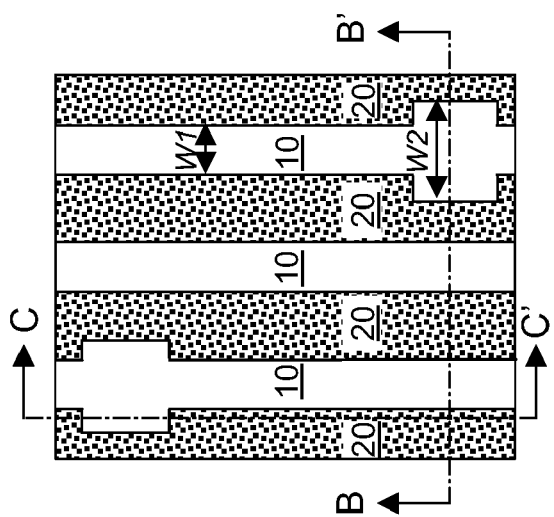
Figure 9B:
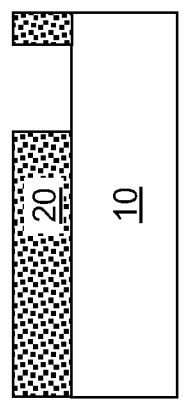

Referring to FIGS. 9A, 9B, and 9C, the remaining portion of the first photoresist 30 and the second photoresist 20 in the first exemplary lithographic structure are exposed and developed in the same manner as described above at the steps of the second exposure and the second development.

The second pattern includes a plurality of line troughs running in the vertical direction, i.e., in the direction perpendicular to the direction of the line troughs in the first pattern in the remaining portion of the first photoresist 20 prior to removal thereof. Each of the plurality of line troughs includes a narrow portion having a first width W1, which corresponds to the first width W1 of the first and second exemplary wiring structures of FIGS. 2A and 2B. Further, at least one of the plurality of line troughs includes a bulge portion having a second width W2, which corresponds to the second width W2 of the first and second exemplary wiring structures of FIGS. 2A and 2B. The location of each bulge portion in the line troughs coincides with the area of the cavities in the first pattern.

The remaining portion of the first photoresist 30, which has the first pattern, and the second photoresist 20 are simultaneously lithographically exposed with a light exposure pattern generated by a fourth lithographic mask 400, which is shown in FIG. 9D and containing a pattern of a set of parallel lines of a constant width. Specifically, the fourth lithographic mask 400, which is loaded into a lithography tool and placed in the optical path of light during the second exposure, comprises a nested array of transparent portions 402 interlaced with a nested array of opaque portions 420. The set of parallel lines run in the vertical direction, which is perpendicular to the direction of line troughs in the first pattern. The fourth lithographic mask 400 may contain substantially the same pattern as the second lithographic mask 200.

The light exposure pattern generated by the second lithographic mask 200 has a modulation of light intensity in a direction perpendicular to the set of parallel lines, i.e., in the horizontal direction corresponding to the pattern of vertical lines in the fourth lithographic mask 400 in the same manner as in the steps of the second exposure and the second development of the first exemplary lithographic structure described above. During the second development, all of the remaining portions of the first photoresist having the first pattern are developed and removed.

The second exemplary lithographic structure may be employed to form a wiring structure in the same manner as described above.

Figure 10C:
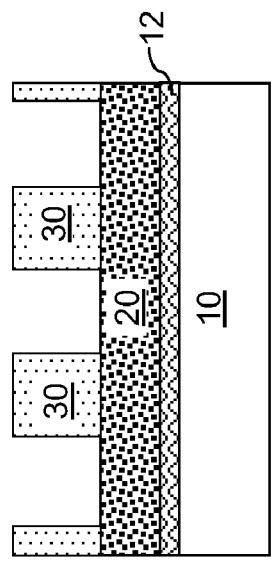
FIGS. 10A, 10B, and 10C are views of a third exemplary lithographic structure at a step after formation of a first pattern in a first photoresist 30.
Figure 10A:
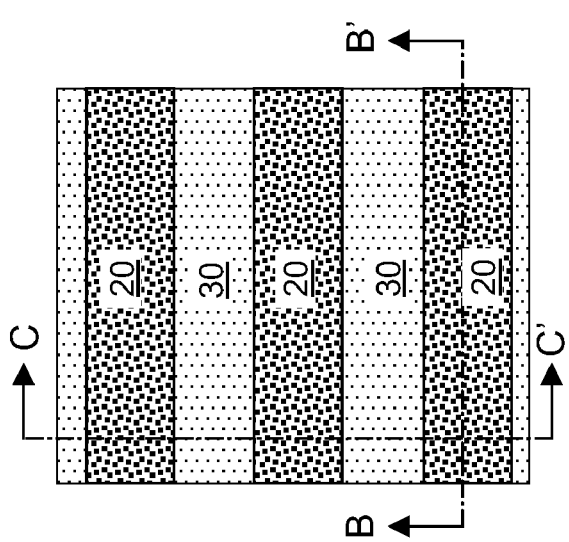
Figure 10B:
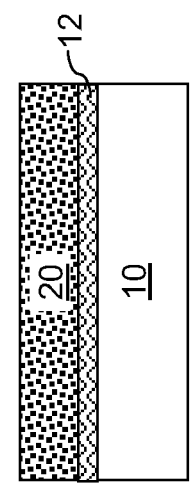

Embodiments in which an anti-reflective coating layer is employed are explicitly contemplated herein. Referring to FIGS. 10A, 10B, and 10C, a third exemplary lithographic structure is shown at a step corresponding to the step of FIGS. 5A, 5B, and 5C of the first exemplary lithographic structure. The third exemplary lithographic structure is derived from the first exemplary lithographic structure by forming an anti-reflective coating (ARC) layer 12 between the substrate 10 and the second photoresist 20. Specifically, the ARC layer 12 is applied directly on the top surface of the substrate, followed by application of the second photoresist 20 on the top surface of the ARC layer 12. The same processing steps employed to form the first exemplary lithographic structure may be subsequently employed to form the third exemplary lithographic structure.

Figure 11C:
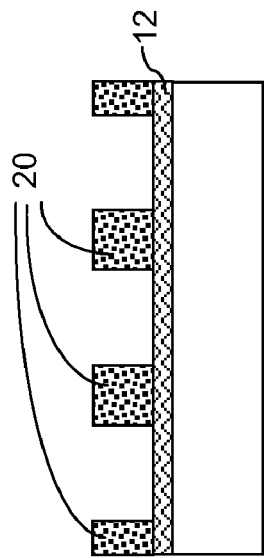
FIGS. 11A, 11B, and 11C are views of the third exemplary lithographic structure at a step after formation of a second pattern in the second photoresist 20.
Figure 11A:
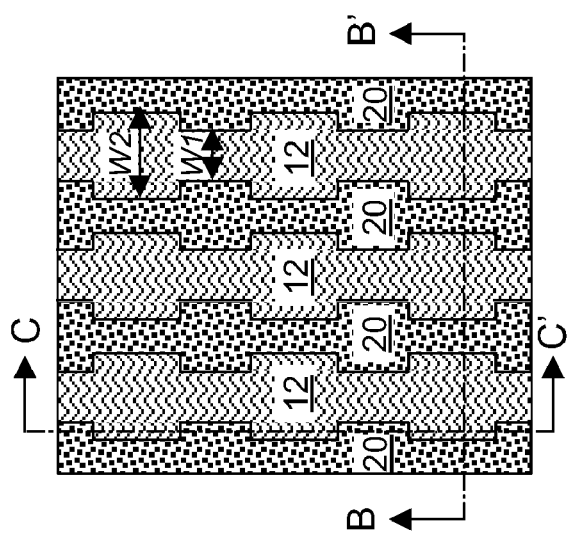
Figure 11B:
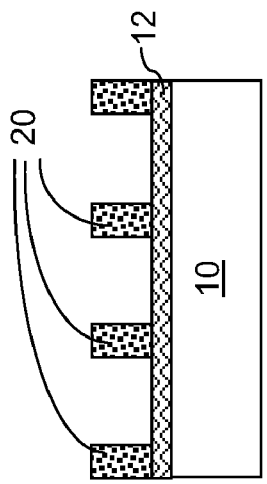

Since the ARC layer 12 is not photosensitive, continuation of processing employing the methods for forming the first exemplary lithographic structure provides the third exemplary lithographic structure shown in FIGS. 11A, 11B, and 11C. Portions of the ARC layer 12 that are not covered by the second photoresist may be removed thereafter by an etch, such as an anisotropic reactive ion etch, to transfer the second pattern in the second photoresist to form a wiring structure such as the first, second, or third exemplary wiring structure described above.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a patterned structure comprising:
    forming a stack of, from bottom to top, a second photoresist and a first photoresist on a substrate;
    lithographically patterning said first photoresist with a first pattern, wherein a top surface of said second photoresist is exposed in an area of said first pattern; and
    lithographically forming a second pattern in said second photoresist, wherein said second pattern includes a plurality of line troughs, wherein each of said plurality of line troughs includes a narrow portion having a first width, and wherein at least one of said plurality of line troughs includes a bulge portion having a second width greater than said first width, wherein said bulge portion is formed underneath said area of said first pattern, wherein said second pattern is formed by simultaneously lithographically exposing said first photoresist having said first pattern and said second photoresist with a light exposure pattern generated by a lithographic mask containing a pattern of a set of parallel lines of a constant width.

2. The method of claim 1, wherein said second photoresist has a second photosensitivity and said first photoresist has a first photosensitivity, and wherein said first photosensitivity is greater than said second photosensitivity.

3. The method of claim 2, wherein said first photoresist is a positive photoresist that becomes chemically less stable upon exposure.

4. The method of claim 3, wherein said second photoresist is another positive photoresist that becomes chemically less stable upon exposure.

5. The method of claim 2, wherein said first photoresist comprises a grey resist.

6. The method of claim 2, wherein said first photoresist comprises a first photosensitive chemical and said second photoresist comprises a second photosensitive chemical, wherein said first photosensitive chemical has greater photosensitivity than said second photosensitive chemical.

7. The method of claim 1, wherein said first width is a lithographic width of a lithography tool employed to expose said first photoresist with said first pattern and said second photoresist.

8. The method of claim 7, wherein a first narrow portion in one of said plurality of line troughs and a second narrow portion in a neighboring line trough of said plurality of line troughs are separated by a lithographic spacing of a lithography tool employed to expose said first photoresist with said first pattern and said second photoresist.

9. The method of claim 8, wherein said first narrow portion is separated from a bulge portion in said neighboring line trough by a separation distance equal to a sum of said lithographic width and said lithographic spacing less said second width.

10. The method of claim 9, wherein said separation distance is a sublithographic dimension.

11. The method of claim 8, wherein said lithographic width is a minimum lithographic width and said lithographic spacing is a minimum lithographic spacing.

12. The method of claim 1, wherein said light exposure pattern has a modulation of light intensity in a direction perpendicular to said set of parallel lines, wherein light intensity is non-zero throughout an exposure field.

13. The method of claim 12, wherein an entirety of said first photoresist having said first pattern is exposed, while exposed portions of said second photoresist forms said second pattern.

14. The method of claim 13, further comprising developing and removing said entirety of said first photoresist having said first pattern.

15. The method of claim 1, further comprising:
    transferring said second pattern into said substrate by etch, wherein said second pattern is replicated in an upper surface of said substrate; and
    forming a plurality of conductive lines embedded in said substrate, wherein each of said plurality of conductive lines includes a narrow conductive portion having a third width, and wherein at least one of said plurality of conductive lines includes a conductive bulge portion having a fourth width greater than said third width.

16. The method of claim 15, wherein said third width is substantially the same as said first width, and wherein said fourth width is substantially the same as said third width.

17. The method of claim 1, further comprising forming an anti-reflective coating (ARC) layer directly on said substrate, wherein said second photoresist is formed directly on said ARC layer, wherein said ARC layer is not photosensitive.

* * * * *